United States Patent
Guenter et al.

(10) Patent No.: US 7,418,021 B2
(45) Date of Patent: *Aug. 26, 2008

(54) OPTICAL APERTURES FOR REDUCING SPONTANEOUS EMISSIONS IN PHOTODIODES

(75) Inventors: James K. Guenter, Garland, TX (US); Jimmy A. Tatum, Plano, TX (US); James R. Biard, Richardson, TX (US)

(73) Assignee: Finisar Corporation, Sunnyvale, CA (US)

( * ) Notice: Subject to any disclaimer, the term of this patent is extended or adjusted under 35 U.S.C. 154(b) by 283 days.

This patent is subject to a terminal disclaimer.

(21) Appl. No.: 11/026,355

(22) Filed: Dec. 30, 2004

(65) Prior Publication Data

US 2005/0286584 A1    Dec. 29, 2005

Related U.S. Application Data

(63) Continuation-in-part of application No. 10/877,915, filed on Jun. 25, 2004, now Pat. No. 7,184,454.

(51) Int. Cl.
   *H01S 5/00* (2006.01)
(52) U.S. Cl. .................... 372/50.21; 372/50.1
(58) Field of Classification Search ............. 372/50.1, 372/50.21
   See application file for complete search history.

(56) References Cited

U.S. PATENT DOCUMENTS

| | | | |
|---|---|---|---|
| 5,475,701 A | | 12/1995 | Hibb-Brenner |
| 5,606,572 A | * | 2/1997 | Swirhun et al. ............ 372/96 |
| 5,978,401 A | | 11/1999 | Morgan |
| 6,034,981 A | * | 3/2000 | Kim ................ 372/50.21 |
| 6,483,862 B1 | * | 11/2002 | Aronson et al. ......... 372/50.21 |
| 6,707,027 B2 | | 3/2004 | Liess et al. |
| 6,717,972 B2 | * | 4/2004 | Steinle et al. ............ 372/50.21 |
| 6,813,293 B2 | * | 11/2004 | Johnson et al. ......... 372/46.015 |
| 7,184,455 B2 | * | 2/2007 | Guenter et al. ........... 372/50.21 |

(Continued)

FOREIGN PATENT DOCUMENTS

WO    WO 02/37124    5/2002    ................ 3/36

(Continued)

OTHER PUBLICATIONS

U.S. Appl. No. 11/026,095 filed Dec. 30, 2004 entitled "Obsorbing Layers for Reduced Spontaneous Emission Effects in Integrated Photodiode.".

(Continued)

*Primary Examiner*—Minsun Harvey
*Assistant Examiner*—Phillip Nguyen
(74) *Attorney, Agent, or Firm*—Workman Nydegger

(57) ABSTRACT

An optical structure that reduces the effects of spontaneous emissions from the active region of a laser. An optical structure includes optimizations to reduce the effects of spontaneous emissions. The optical structure includes a VCSEL with top and bottom DBR mirrors and an active region connected to the mirrors. The optical structure further includes a photodiode connected to the VCSEL. One or more optimizations may be included in the optical structure including optically absorbing materials, varying the geometry of the structure to change reflective angles, using optical apertures, changing the reflectivity of one or more mirrors, changing the photodiode to be more impervious to spontaneous emissions, and using ion implants to reduce photoluminescence efficiency.

7 Claims, 7 Drawing Sheets

U.S. PATENT DOCUMENTS

2003/0021322 A1\*  1/2003  Steinle et al. ................. 372/50
2005/0041715 A1\*  2/2005  Kim ........................... 372/50

FOREIGN PATENT DOCUMENTS

WO    WO 02/37410    5/2002    ..................... 11/8
WO    WO 02/37411    5/2002    ..................... 11/8

OTHER PUBLICATIONS

U.S. Appl. No. 11/027,383 filed Dec. 30, 2004 entitled "Geometric Optimizations for Reducing a Spontaneous Emissions in Photodiodes.".

U.S. Appl. No. 11/027,717 filed Dec. 30, 2004 entitled "Optimizing Mirror Reflectivity for Reducing Spontaneous Emissions in Photodiodes.".

U.S. Appl. No. 11/026,385 filed Dec. 30, 2004 entitled "Mirrors for Reducing the Effects of Spontaneous Emissions in Photodiodes.".

U.S. Appl. No. 11/026,495 filed Dec. 30, 2004 entitled "Photodiode Bandgaps for Reducing Spontaneous Emissions in Photodiodes.".

\* cited by examiner

OPTICAL APERTURES FOR REDUCING SPONTANEOUS EMISSIONS IN PHOTODIODES

CROSS-REFERENCE TO RELATED APPLICATIONS

This application is a continuation-in-part of U.S. application Ser. No. 10/877,915, titled "Light Emitting Device With an Integrated Monitor Photodiode" filed Jun. 25, 2004 now U.S. Pat. No. 7,184,454, which is incorporated herein by reference.

BACKGROUND OF THE INVENTION

1. The Field of the Invention

The invention generally relates to integrated VCSEL and photodiode combinations. More specifically, the invention relates to methods and apparatuses for reducing the effects of spontaneous emissions from a VCSEL on an integrated photodiode.

2. Description of the Related Art

Lasers have become useful devices with applications ranging from simple laser pointers that output a laser beam for directing attention, to high-speed modulated lasers useful for transmitting high-speed digital data over long distances, to sensors for determining speed, distance, material compositions and the like. Several different types of lasers exist and find usefulness in applications at the present time.

One type of commonly used laser is known as a vertical cavity surface emitting laser (VCSEL). A VCSEL is formed in part by forming a first mirror from Distributed Bragg Reflector (DBR) semiconductor layers on a semiconductor wafer substrate. The DBR layers alternate high and low refractive indices to create the mirror effect. This method creates a mirror that reflects over 99% of on-axis emissions.

An active layer is then formed on the first mirror. The active layer includes a number of quantum wells for stimulating the emission of laser energy. The active layer includes a pn semiconductor junction. It is in the active layer that electrons switching from the conduction band to the valance band produce photons. Below a threshold current for a given VCSEL, light is emitted spontaneously. When a laser is biased by a current above the given threshold, laser emissions are more prevalent, although spontaneous emissions continue to be a portion of the active layer output. Spontaneous emissions tend to be at a number of different wavelengths and tend to radiate isotropically (equally in all directions) from the active layer. Laser emissions tend to be in a very narrow wavelength band centered around a frequency for which the VCSEL was designed and tend to radiate axially in the direction of the vertical axis of the VCSEL. Notably while the VCSEL and vertical axis are used herein and connote a particular orientation, those of skill in the art will appreciate that the vertical axis can be positioned in a horizontal axis, or any other orientation. Vertical, as used herein, simply refers to the axis along which epitaxial layers (as described in more detail below) are formed.

A second mirror is formed on the active layer using more DBR semiconductor layers. Thus the VCSEL laser cavity is defined by top and bottom mirrors which cause a laser beam to be emitted from the surface of the laser. The second mirror has a reflectivity of over 98-99.5% for on axis emissions.

As alluded to above, a VCSEL is typically forward biased by a current. Forward biasing involves connecting a higher potential (voltage) source at the anode (near the p type material of the pn junction) while a lower potential source is connected at the cathode (near the p type material of the pn junction) of the VCSEL. Currents through the VCSEL above a threshold current cause laser emissions from the active layer.

In some simple applications, the lasers may be operated open loop. I.e., the lasers do not require feedback, or can operate satisfactorily without feedback. For example, in most laser pointer applications, the output power of the laser beam may be controlled without reference to the actual output power. In other applications, it may be very important to precisely gauge the amount of actual output power emitted by the laser while it is operating. For example, in communications applications it may be useful to know the actual output power of the laser such that the output power of a laser may be adjusted to comply with various standards or other requirements. Additionally, in sensor applications, it is useful to gauge the effects of conditions external to the VCSEL by monitoring the VCSEL output power.

Many applications use a laser in combination with a laser power monitoring photodiode or other photosensitive device. A photodiode has current characteristics that change as light impinges the diode. The photodiode either has no bias or is implemented in a reverse bias configuration such that the cathode is connected to a higher potential while the anode is connected to a low voltage or ground. In a photodiode in the reverse biased or unbiased configuration, current is generated within the photodiode as light impinges the photodiode.

An appropriately placed photodiode may be used as one element in the feedback circuit for controlling the laser. Photodiodes are typically fabricated of the same or similar semiconductor materials as VCSEL diodes. Recent technology therefore, has focused on implementing a photodiode and VCSEL diode monolithically together on the same substrate. Exemplary fabrications include epitaxially forming a photodiode on a substrate followed by forming a VCSEL on top of the photodiode. Other fabrications include forming a VCSEL on one side of a wafer substrate and the photodiode on the other side of the wafer substrate. Still other fabrications include forming a VCSEL on a substrate followed by forming a photodiode on top of the VCSEL. Additionally, the photodiode may be placed within a mirror that is part of the VCSEL.

One challenge that arises when a VCSEL and photodiode are formed together monolithically on a substrate relates to photons caused by spontaneous emissions being received by the photodiode. A VCSEL has photon emissions caused by spontaneous emissions and laser emissions. As described above, spontaneous emissions are typically undesirable emissions that are emitted from the active layer of the VCSEL. Spontaneous emissions may be at a variety of wavelengths. Laser emissions are typically emitted axially along the vertical axis from the active layer of the VCSEL at the wavelength for which the VCSEL was designed.

Photons emitted due to spontaneous emission often couple to photodiodes formed monolithically with a VCSEL better than photons caused by laser emissions. Illustratively, an axially directed photon, such as laser emission typically predominately include, will likely be reflected by a bottom DBR mirror before reaching a photodiode formed under the bottom DBR mirror. As previously stated herein, on axis emissions are reflected with more than 99% efficiency. On the other hand, photons caused by spontaneous emission that are off axis and directed toward the photodiode, will more easily pass through the bottom DBR mirror to the photodiode. Additionally, spontaneously emitted photons that are directed away from the bottom mirror and the photodiode will likely be, at least partially, reflected towards the photodiode.

Total internal reflection occurs when a light beam encounters an interface of two materials with different refractive indices at an angle at or above a critical angle. Total internal reflection will occur in a VCSEL at the VCSEL/air interface at the top of the VCSEL. At this interface, the critical angle is about 15°, which results in a large percentage of the light being totally internally reflected. An interface with different refractive indices also exists at the interface between the active layer and the bottom mirror. The critical angle at this interface is 60-70°, which results in a large percentage of light traveling towards the bottom mirror being passed through the bottom mirror to the photodiode. Therefore, a large amount of the spontaneous emissions will be directed at one time or another towards the photodiode. Further, the majority of photons directed towards the edges of a VCSEL will be totally internally reflected such that they are likely to impinge the photodiode.

The photons caused by spontaneous emission, in one worst case scenario, can completely swamp the signal caused by laser emissions. The photons caused by spontaneous emission cause difficulties in determining the correct amount of laser energy emitted by laser emission from a VCSEL.

It would therefore be useful to minimize the amount of spontaneously emitted photons reaching a photodiode integrated with a VCSEL.

BRIEF SUMMARY OF THE INVENTION

One embodiment includes an optical structure. The optical structure includes a VCSEL. The VCSEL includes: a top DBR mirror, an active region coupled to the top DBR mirror, and a bottom DBR mirror coupled to the active region. The optical structure further includes a photodiode coupled to the VCSEL. An optical aperture is formed between the VCSEL and the photodiode and configured to block spontaneous emissions.

Another embodiment includes a method of manufacturing an optical structure. The method includes forming a VCSEL. Forming the VCSEL includes: forming a top DBR mirror, forming an active region coupled to the top DBR mirror, and forming a bottom DBR mirror coupled to the active region. The method further includes forming a photodiode coupled to the VCSEL. Additionally, an optical aperture is formed between the VCSEL and the photodiode and configured to block spontaneous emissions.

Advantageously, embodiments described above help to limit the amount of spontaneous emissions detected by an integrated photodiode. This helps to reduce error from spontaneous emissions.

These and other advantages and features of the present invention will become more fully apparent from the following description and appended claims, or may be learned by the practice of the invention as set forth hereinafter.

BRIEF DESCRIPTION OF THE SEVERAL VIEWS OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

Embodiments described herein, implement various optimizations to reduce the amount of spontaneous emissions reaching a photodiode in an integrated VCSEL photodiode combination structure. Such optimizations include using absorbing layers at various portions of the structure, varying the geometry of the structure to change reflective angles, using optical apertures to the photodiode, changing the reflectivity of the mirror, changing the photodiode fabrication to be more impervious to spontaneous emissions at wavelengths different than the laser emissions, creating absorbing contacts, and using doping and implants to reduce photoluminescence caused by reemission of photons from absorbing materials.

Figure 1:
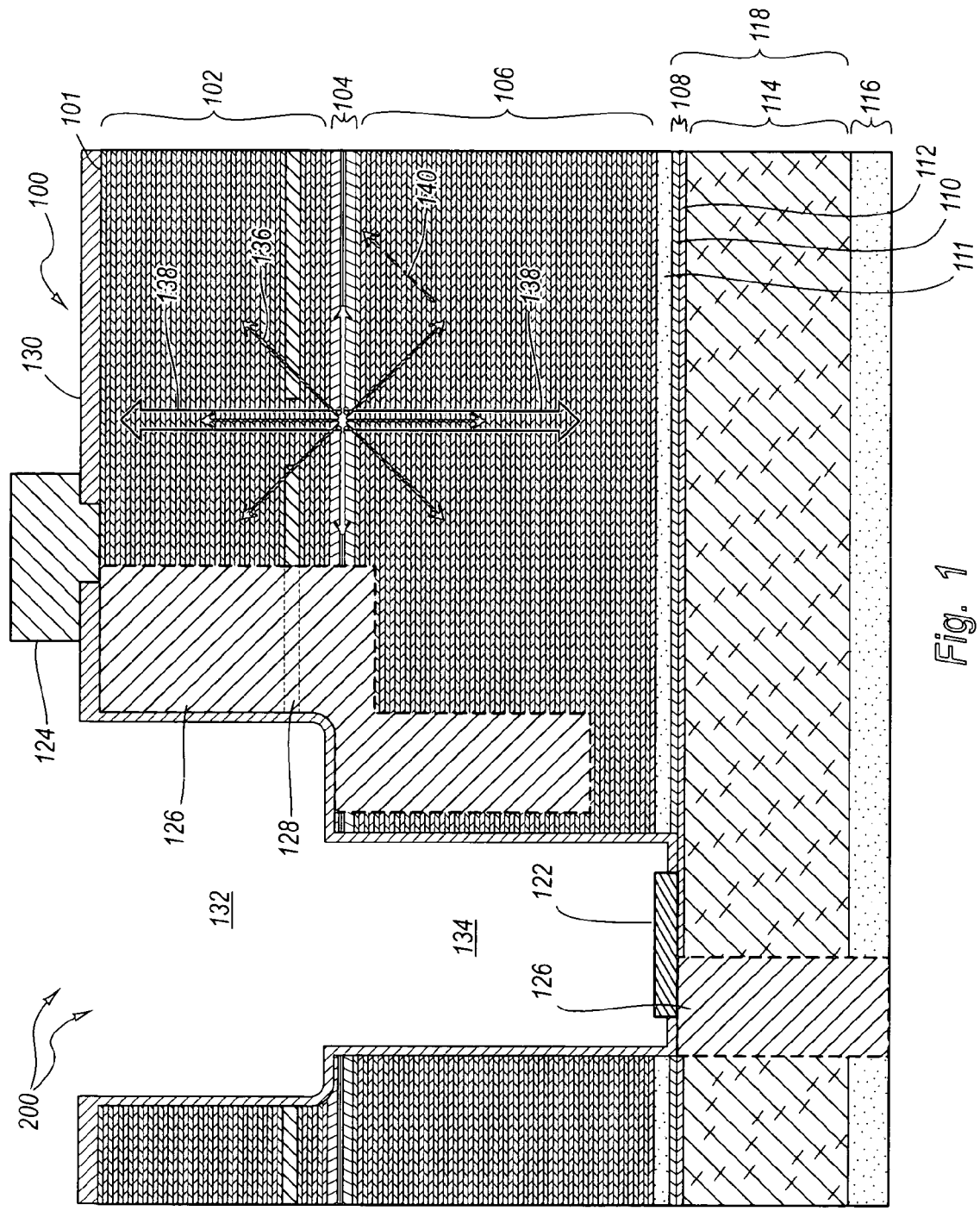
FIG. 1 illustrates an exemplary VCSEL where principles of the present invention may be practiced.

An integrated photodiode and VCSEL structure will now be described with reference to FIG. 1. Notably, this example is simply one example of an integrated photodiode and VCSEL such as is described in U.S. Provisional patent application Ser. No. 10/877,915, titled "Light Emitting Device With an Integrated Monitor Photodiode." Other types of VCSELs and photodiodes may be used, including but not limited to mesa, oxide, proton implant and regrowth structures. An example of an optoelectronic device including an epitaxial structure 100 that includes layers formed on a wafer substrate 116 is shown. In one embodiment, the structure 100 is grown using a GaAs wafer. However, other III-V (three-five) semiconductor combinations may also be used. FIG. 1 shows a vertical cavity surface emitting laser (VCSEL) 101. The VCSEL 101 in the example shown includes a top mirror 102, an active region 104, and a bottom mirror 106. A pn junction exists in the active region 104.

A spacer layer 111 is formed below the bottom mirror 106. The spacer layer 111 is preferably about $5\lambda/4$ or $7\lambda/4$ where $\lambda$ is the wavelength of light that the VCSEL 101 is designed to emit. The spacer layer 111 may be any odd integral multiple of the wavelength $$\left(\text{i.e., } \frac{\lambda(1+n)}{4} \text{ where } n \text{ is an integer}\right)$$

that is thick enough to account for non-uniformities that may occur in various layers of the epitaxial structure 100. The spacer layer 111 should be sufficiently thick such that when etching is done to the spacer layer 111 the deepest non-uniformities do not go all the way through the spacer layer 111 and the shallowest potions reach the spacer layer 111. The goal, therefore, is to expose the spacer layer 111 without going all the way through the spacer layer 111 at any point. Subsequent processing uses a selective etchant such as dilute hydrofluoric acid to uniformly expose the layer underlying the spacer layer 111.

The epitaxial structure 100 further includes a tunnel diode 108, formed on and electrically connected to the VCSEL 101. The tunnel diode 108 includes a heavily doped n+ layer 110 and a heavily doped p+ layer 112.

The epitaxial structure 100 further includes a photodiode 118, formed on and electrically connected to the tunnel diode 108, which includes a second pn junction that is comprised of the heavily doped p+ layer 112 of the tunnel diode 108 and a lightly doped photodiode n layer 114. An additional p layer (not shown) that is not as heavily doped may also be fabricated between the p+ layer 112 and the photodiode n layer 114. In one embodiment, the epitaxial structure 100 is fabricated on an n type substrate 116. Although the substrate 116 is shown in FIG. 1 as a thin layer, the substrate is actually in one embodiment of the invention in the hundreds of microns whereas the epitaxial structure including the photodiode 118, the tunnel diode 108, and the laser diode 101 is about 10 microns. The epitaxial structure 100 is generally grown using a metal organic chemical vapor phase deposition (MOC-MVD) process.

The tunnel diode 108 acts as a common connection between the photodiode 118 and the VCSEL 101. In the embodiment shown, this allows a single power supply to be used to bias both the photodiode 118 and the VCSEL 101. Other connections may also be used to connect the photodiode 118 and VCSEL 101. For example, a metal deposition may be used to short the tunnel diode 108. Alternatively, other type of layers may be used and shorted by a metal deposition. In yet other embodiments, the photodiode 118 and VCSEL 101 may share a common cathode or anode. Further still, other embodiments exist where the photodiode 118 and VCSEL 101, while formed lithographically near one another, are electrically isolated.

The top mirror 102 is a distributed Bragg reflector (DBR) that generally comprises a number of alternating layer with high and low indexes of refraction. This creates a mirror with high reflectivity, around 99.5%. In the example shown, the top mirror is fabricated of p type materials such as carbon doped aluminum gallium arsenide (AlGaAs), where the fraction of Al can vary from 0% to 100%. The top mirror 102 includes about 20 mirror periods where each period includes a high index of refraction layer and a low index of refraction layer.

The active region 104 includes a number of quantum wells for stimulating the emission of laser energy. In the embodiment shown, active region 104 is less than 1 micron.

Below the active region is a bottom mirror 106. The bottom mirror is comprised of about 30 to 35 doped n type mirror periods. Silicon is one example of a dopant that may be used in the bottom mirrors to create an n type material.

It would advantageous to balance the thickness of the heavily doped p+ layer 112 such that appropriate conduction exists through the tunnel diode 108 while maintaining appropriate transparency. Thus, in one embodiment of the invention, the heavily doped p+ layer 112 is about 50 to 100 nanometers and preferably at least $3 \times 10^{19}$ of p type material (e.g., when used in an 850 nm laser). The heavily doped n+ layer may be nearly any practicable thickness without imposing an optical penalty.

Below the tunnel diode 108 is a photodiode 118. The photodiode 118 should be fabricated so as to have an appropriate responsivity to incoming light. Thus, in one embodiment of the invention, the photodiode 118 includes a lightly doped n layer 114 that is approximately three microns or less when the VCSEL 101 is designed to emit an 850 nm wavelength. One embodiment of the invention includes a lightly doped n layer 114 that is about 1.5 microns. Notably, the thickness of the lightly doped n layer 114 can be used to tailor the responsivity and speed of the photodiode.

Contacts and oxide layers are formed through a photolithographic process. The formation of contacts allows appropriate biasing to be applied to, and signals to be read from the VCSEL 101 and photodiode 118. The lithographic process includes a series of acts where photoresist is applied to the epitaxial layers 100. The photoresist is then exposed lithographically to various patterns. Lithographic exposure allows a pattern of photoresist to remain on the epitaxial layers 100 while the remainder of the photoresist may be washed from the epitaxial layers 100.

The patterns of photoresist that remain on the epitaxial layers 100 block ions from being implanted in the epitaxial layers 100, metal from being deposited on the epitaxial layers 100, and etching solutions from etching portions of the epitaxial layers 100. Thus, using appropriate photolithographic processes a monolithic structure 200 that includes a VCSEL 101, a tunnel diode 108 and a photodiode 118 may be fabricated with appropriate contacts and with appropriate isolation from other devices on a wafer being fabricated simultaneously.

In the example shown in FIG. 1, a tunnel diode contact 122 is formed such that it connects to the heavily doped p layer 112. A VCSEL contact 124 is formed such that it connects to the top mirror 102 of the VCSEL 101. Another contact may be formed on the bottom of the substrate 116 to provide the appropriate contact to the photodiode 118. Isolation barriers 126 are formed to isolate the VCSEL 101 and the photodiode 118 from other devices being formed on the substrate 116. An aperture 128 is oxidized into the top mirror 102. The aperture 128 is used primarily to direct current flow through the VCSEL 101.

More specifically, the VCSEL 101 is fabricated from an epitaxial structure 100. The epitaxial structure 100 has a dielectric such as silicon dioxide or silicon nitride grown on it to form a portion of the dielectric layer 130. A shallow trench mask is used to remove portions of the oxide using an etching process. An etch process is used to form the shallow trench 132 in the VCSEL 101. The aperture 128 can then be oxidized into the VCSEL 101.

A deep trench mask can then be used to etch the deep trench 134. An etch can be used to etch down to a thick AlAs spacer 111. This spacer may be AlAs or another AlGaAs composition, so long as the fraction of aluminum is substantially greater than that in the underlying layer. A stop etch may be used to etch through the AlAs spacer 111 to the n+ layer 110. Another etch can be used to etch through the n+ layer 110 to the p+ layer 112. At this point, an additional oxide may be grown that forms additional portions of the dielectric layer 130. Portions of the dielectric layer 130 are removed followed by deposition of metal to form contacts 122, 124 on the optoelectronic device 200.

While this example shows a photodiode 118 under a VCSEL 101 coupled using a tunnel diode 108, other structures may also be used. For example, the tunnel diode 108 may be shorted by metal so as form an ohmic contact between the VCSEL 101 and the photodiode 118. Other materials than the tunnel junction materials may be used between the VCSEL and the photodiode with an ohmic contact connecting the VCSEL and the photodiode. The VCSEL and the photodiode may be fabricated such that they do not share a common connection. The photodiode may be fabricated on the VCSEL. Other fabrications may be implemented as well.

FIG. 1 illustrates emissions from the active region 104 of the VCSEL 101. The emissions shown in FIG. 1 include spontaneous emissions 136 and laser emissions 138. The spontaneous emissions 136 are isotropic and therefore include a large off-axis portion. The laser emissions 138 on the other hand are generally on-axis emissions.

The following descriptions describe generally several optimization fabrications that may be used to decrease the amount of spontaneous emissions reaching the photodiode 118. Each of these fabrications will be discussed in more detail following the general descriptions.

One category of optimizations that may be implemented relates to fabricating absorbing layers designed to absorb spontaneous emissions before they can reach the photodiode 118. For example, in one embodiment, an absorbing composition may be fabricated in the mirror layers of the DBR mirrors 102, 106. Preferably, the absorbing composition is fabricated in mirror layers with a low bandgap. In another embodiment, an absorbing composition may be fabricated in the VCSEL 101 at locations in the epitaxial structure 100 where the standing electric field (E-field) is at a minimum. In another embodiment, an absorbing composition may be fabricated between the bottom mirror 106 and the photodiode 118. Embodiments with an absorbing composition between the mirror 106 and photodiode may be implemented, in one example, when the tunnel diode 108 is shorted by an ohmic contact.

Other optimizations may be included as well. For example, one embodiment may include designing the VCSEL contacts 124 to absorb spontaneous emissions 136. Embodiments may include doping or implanting surrounding structure to minimize photoluminescence efficiency to prevent photons from being re-emitted after being absorbed by an absorbing material.

Another category of optimization relates to geometric designs of an epitaxial structure 100. For example, the VCSEL 101 shown in FIG. 1 is commonly referred to as a mesa structure. This naming results from the etching that is performed to produce the trenches 132, 134 resulting in a "mesa" that includes the VCSEL. Mesa structures may have a mesa that includes more or less than what is shown in FIG. 1. The walls of the mesa provide an interface of a material of one index of refraction (the semiconductor layers) and a material with a different index of refraction (open air). This interface results in some or all of an optical emission being reflected back into the VCSEL cavity and likely into the photodiode 118. To combat the reflections, the mesa structure walls may be ridged or textured so as to create irregularities with angles that cause the light contacting the mesa walls to be refracted out of the VCSEL cavity or that scatters light in the VCSEL cavity.

Another category of optimization relates to creating a photodiode optical aperture. The photodiode optical aperture may be fabricated between the VCSEL 101 and the photodiode 118. In one embodiment, the photodiode optical aperture includes a partially oxidized or etched layer between the bottom mirror 106 and the photodiode 118. The aperture may be formed such that on-axis emissions, such as laser emissions 138, pass through the open aperture to the photodiode 118 while off-axis emissions, such as much of the spontaneous emissions 136, are blocked from entering the photodiode 118 by the oxidized or etched portion of the aperture.

Another category of optimizations relates to changes in the DBR mirror structures. For example, in one embodiment, additional mirror layers may be added to the bottom DBR mirror 106 to increase off-axis reflections, such as those that are common from spontaneous emissions 136. Another change that may be implemented in the DBR mirrors includes optimizing the composition of the mirrors to decrease the angle at which total internal reflection begins.

Another category of optimizations relates to changes in the fabrication of the photodiode 118. For example, one optimization includes increasing the bandgap in the photodiode 118 to reduce responsivity of the photodiode above the wavelength for which the VCSEL 101 is designed. Another optimization involves fabricating a wide bandgap layer beneath the photodiode to prevent substrate absorption contribution to long wavelength responsivity. Yet another embodiment focuses on increasing measurements of the laser emissions 138. This embodiment includes fabricating a DBR mirror under the photodiode 118. The reflectivity of the DBR mirror under the photodiode 118 is fabricated so as to efficiently reflect the wavelength of light of the laser emission 138. Reflections from the DBR mirror under the photodiode result in the photodiode getting a "second chance" at the laser emission 138, once when the laser emission passes through the photodiode 118 toward the DBR mirror, and once when the laser emission 138 is reflected off the DBR mirror back into the photodiode 118.

Embodiments may include any combination of the optimizations described above. Thus, the optimizations may be employed individually or in combination with other optimizations.

Absorbing Layers

As mentioned previously, one category of optimizations relates to appropriately placed absorbing layers. Semiconductors in general, and III-V semiconductors (such as Gallium Arsenide (GaAs)) in particular, have spectral absorption properties that vary with wavelength. For wavelengths longer than that corresponding to the bandgap energy, absorption is generally very low. For shorter wavelengths, absorption is high. The wavelengths at which emissions are more readily absorbed can be controlled by varying the composition of the semiconductors.

Figure 2:
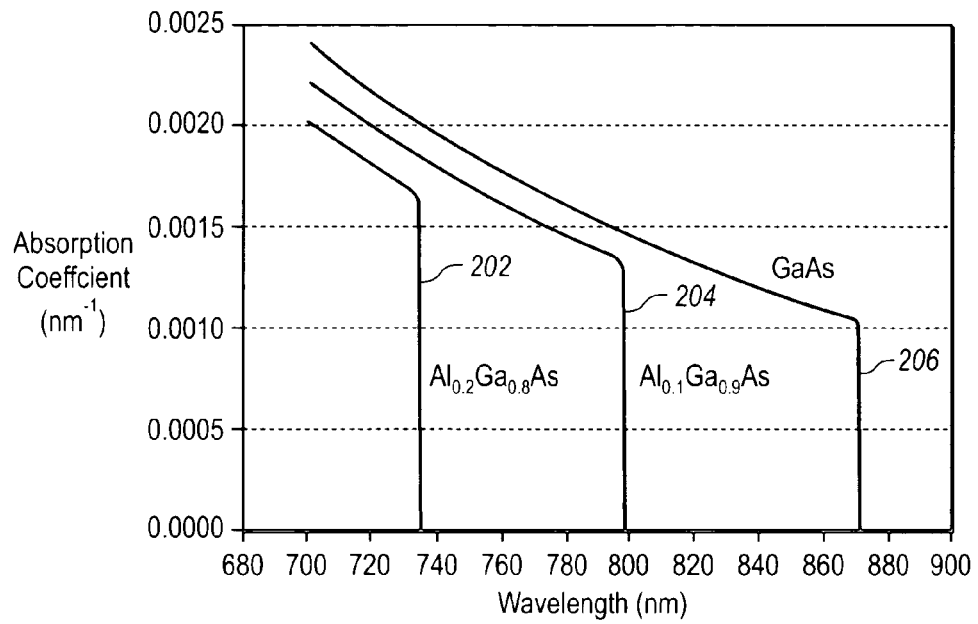
FIG. 2 illustrates a plot of absorption coefficient compared to VCSEL wavelength.

Using one model proposed by M. Aframowitz (SS Comm. 15, vol. 59 (1974)), the graph shown in FIG. 2 can be fabricated. The graph of FIG. 2 illustrates three curves for three different compositions of Aluminum Gallium Arsenide (AlGaAs) semiconductors. The first curve 202 illustrates a composition including a 20% Al composition to an 80% Ga composition. The particular composition results in high absorption of wavelengths below about 735 nm wavelengths. A second curve 204 illustrates the absorption characteristics of a composition that includes 10% Al to 90% Ga. This composition results in high absorption of wavelengths below about 800 nm. A third curve illustrates a composition of 100% Ga. This composition absorbs wavelengths below about 870 nm.

Figure 3:
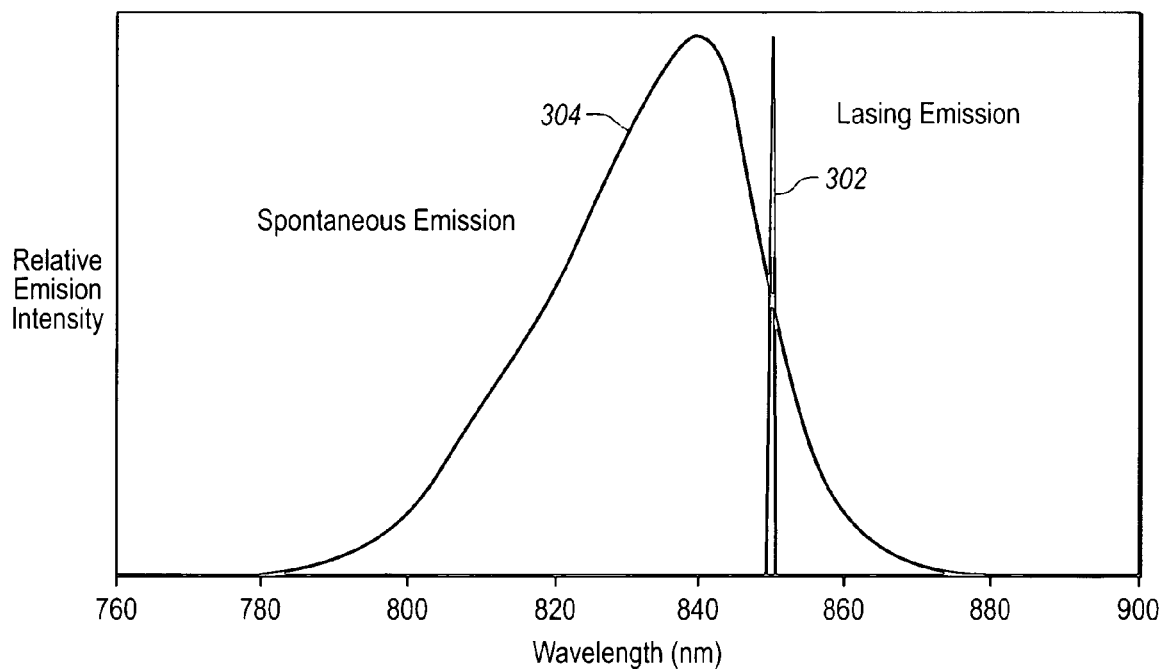
FIG. 3 illustrates a plot of relative emissions intensity versus wavelength for spontaneous and laser emissions.

Ordinarily, VCSEL mirrors, such as the DBR mirrors 102 and 106 shown in FIG. 1, are fabricated to be transparent, or to have low absorption, at the wavelength of laser emissions. Optimizations in one embodiment select compositions for portions of the DBR mirrors 102 and 106 that become absorbing very near the wavelength of laser emission. As discussed previously herein, and referring to FIG. 3, wavelengths of laser emissions tend to be in a very narrow spectrum such as is illustrated by the lasing emission spectrum curve 302 illustrated in FIG. 3. In contrast to this, spontaneous emissions may be in a broader spectrum as shown by the spontaneous emission spectrum curve 304. Thus, by implementing optimizations that become absorbing near the laser emissions, spontaneous emissions below the spectrum of the laser emissions can be selectively absorbed while little, if any, laser emissions are absorbed. These absorbing layers may be substituted for the normally transparent layers in one or both of the DBR mirrors 102 and 106 shown in FIG. 1.

Figure 4:
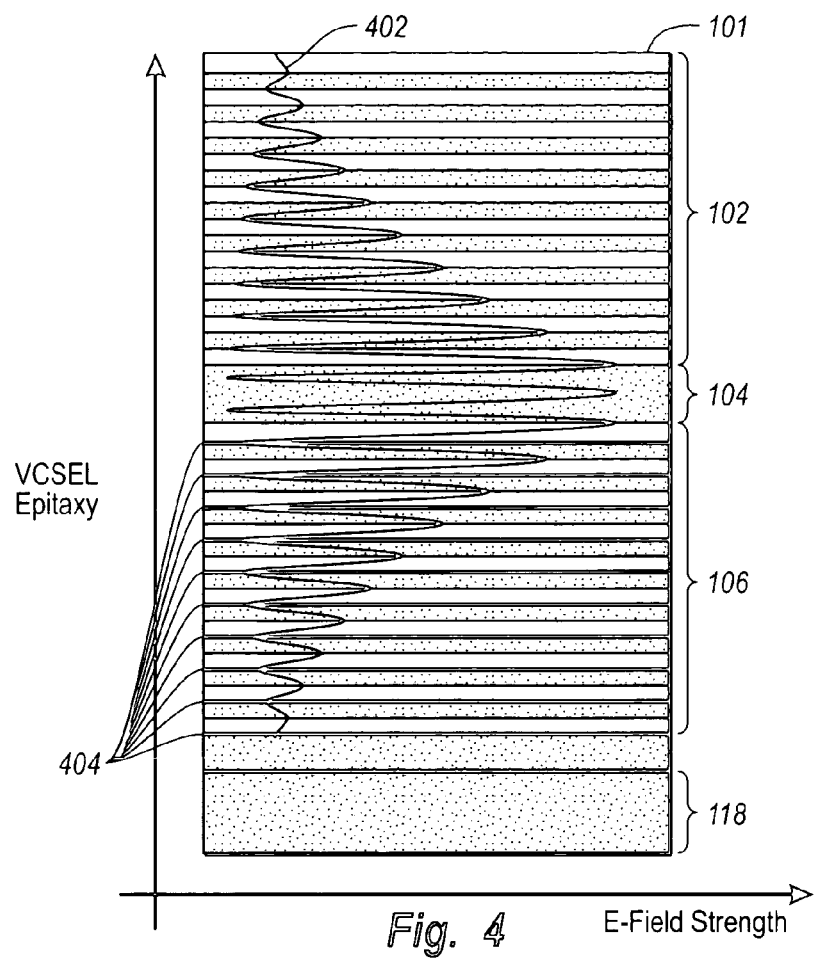
FIG. 4 illustrates a plot of electric field strength versus epitaxial layers in a VCSEL.

To further reduce the amount of laser emissions 138 (FIG. 1) that are absorbed, or to absorb wavelengths of the spontaneous emission 136 (FIG. 1) that are greater than the wavelength of laser emissions 138 (FIG. 1), the location of absorbing material may be carefully selected. Referring now to FIG. 4, this concept may be more fully illustrated. FIG. 4 includes a plot of a standing E-field wave 402 that is formed in the VCSEL 101 when laser emissions are produced in the VCSEL 101. The plot compares E-field strength to locations in the VCSEL epitaxial structure. There are various locations where the E-field wave 402 is at a local minimum. By forming absorbing layers 404 at these local minima, the amount of laser emissions absorbed by the absorbing layers 404 can be reduced. Spontaneous emission at frequencies other than the laser emissions, on the other hand, will produce E-field maximums and minima at locations different than those produced for the laser emissions. Thus, absorption will occur for the spontaneous emissions at locations where the E-field for the spontaneous emissions is higher. This results in higher absorption of spontaneous emissions.

One challenge that arises with absorption materials is a phenomenon known as photoluminescence. Photoluminescence results in light that is absorbed by the absorption layers 404 being re-emitted. Holes and electrons are created through the absorption process in the absorption layers 404. Photoluminescence involves these holes and electrons recombining causing a photon to be emitted. If the photoluminescence efficiency of an absorbing material is high, there is little net reduction in the spontaneous emissions because most absorbed light is re-emitted. However, light that is produced by a photoluminescence is isotropic. This means that some of the light produced by photoluminescence will be at an angle such that it may escape from the VCSEL cavity such that it is not reflected back into the photodiode. The isotropic nature of the re-emitted light results in some net loss of spontaneous emissions in the VCSEL cavity.

Another reduction to photoluminescence may be accomplished by intentionally fabricating the absorbing layers 404 to have low photoluminescence efficiency. This may be accomplished by implementing an epitaxial growth that is intentionally at suboptimal conditions. Alternatively, unusually high doping in the absorption layers 404 may be used to reduce photoluminescence efficiency. In yet another alternative, damage produced by proton implants can produce low photoluminescence efficiency. When embodiments implement suboptimal epitaxial growth or high doping in absorption layers, these modification typically extend across the entire layers where they are implemented. Proton implants, on the other hand, are typically done at the periphery of a device such is illustrated by the isolation implants 126 shown in FIG. 1.

Embodiments may include an absorbing layer between the VCSEL 101 (FIG. 1) and the photodiode 118 (FIG. 1). The absorbing layer between the VCSEL 101 and photodiode 118 may be transparent to laser emissions 138 and absorbing to at least portions of the spontaneous emissions 136. Because spontaneous emissions 136 are typically at wider angles than the laser emissions 138 (due to the isotropic nature of the spontaneous emissions 136), the spontaneous emissions 136 will have a longer path through the absorbing layer toward the photodiode 118 resulting in increased absorption of the spontaneous emissions 136.

Figure 5:
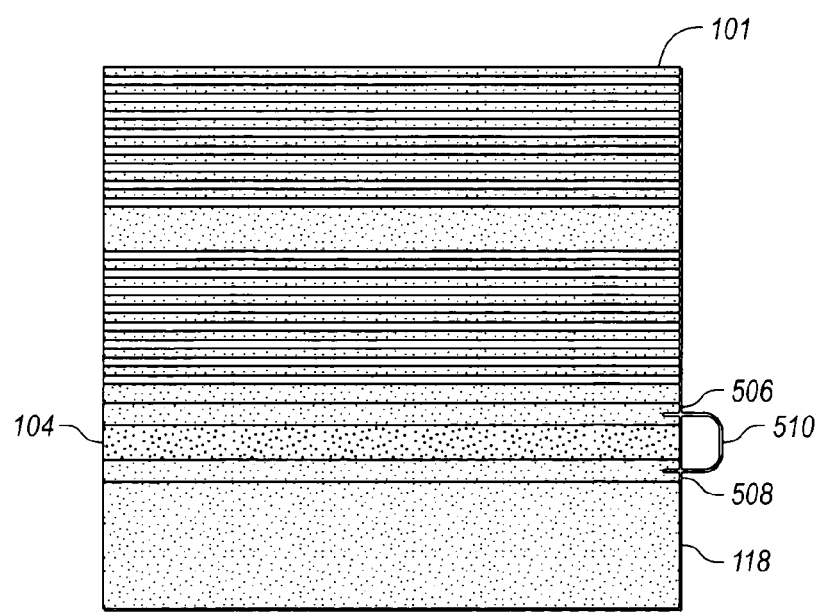
FIG. 5 illustrates an example where a shorted absorbing material may be used.

Referring now to FIG. 5, an embodiment that includes an absorbing layer 404 between the VCSEL 101 and the photodiode 118 is shown. The embodiment shown in FIG. 5 eliminates any photoluminescence from the absorbing layer 404. In the example shown, the absorbing layer 404 is located between a p-type layer 506 and an n-type layer 508. The p-type layer 506 and n-type layer 508 are shorted by a jumper 510. The jumper 510 in this example may be any type of short circuit connection such as, but not limited to, various metal depositions. The short circuit connection is used to prevent photoluminescence from the material that is shorted.

In one embodiment, VCSEL contacts, such as the contacts 124 and 122 in FIG. 1, may be designed to be more absorbing so as to contribute to absorption of the off-axis spontaneous emissions 136. Stated differently, if the contact metal of the contacts 124 and 122 is made less reflective, it will be more absorbing. The contact metal can be made more absorbing by varying composition and thickness. Optimizations may vary depending on where the contact metal is on the VCSEL. Specifically, the optimizations may vary for contact metal that is attached directly to semiconductor materials such as the top DBR mirror 102 at the interface 142 as opposed to contact metal that is attached to a dielectric material such as the dielectric layers 130 as illustrated at the interface 144.

Figure 6:
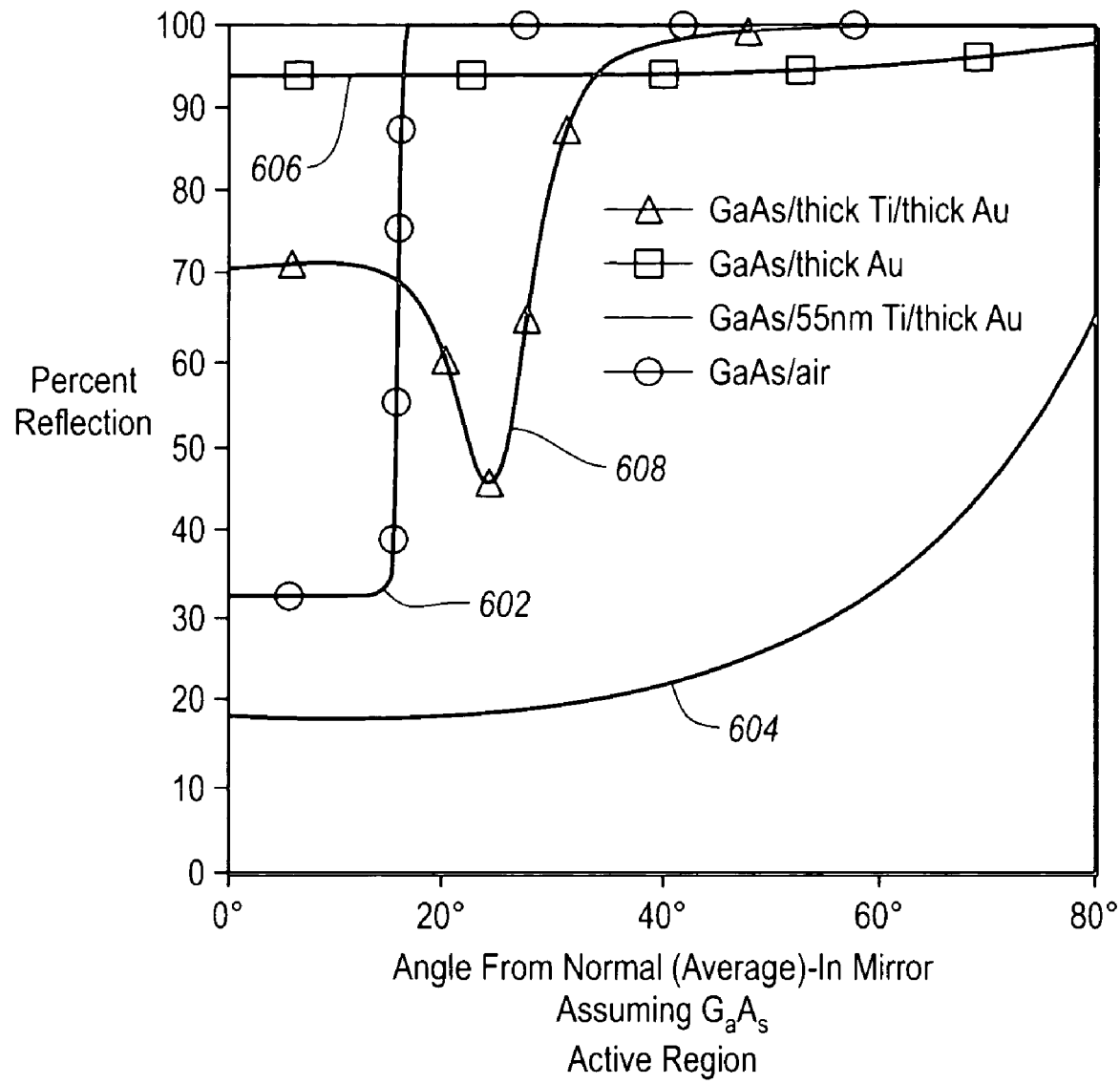
FIG. 6 illustrates a plot showing percentage of reflection to angle from normal for various materials.

Referring to FIG. 6, a graph illustrating the reflective properties where contact material includes gold (Au) over titanium (Ti) is shown. The graph shown in FIG. 6 correlates the percentage of reflection to angle from normal of a spontaneous emission at various interfaces. Curve 602 illustrates reflection at an interface between GaAs and air. Curve 604 illustrates reflections when the interface includes GaAs, 55 nm thick Ti and a thick layer of Au. Figure 606 illustrates reflections at an interface that includes GaAs and a thick layer of Au. Figure 608 illustrates reflections at an interface that includes GaAs with thick Ti and thick Au. Comparing the curves reveals that reflection at a GaAs interface with contact metal is strongly dependant on the Ti thickness. Thus, the Ti thickness can be optimized for a particular angle of off-axis spontaneous emission 136 (FIG. 1).

Geometric Optimizations

Figure 7:
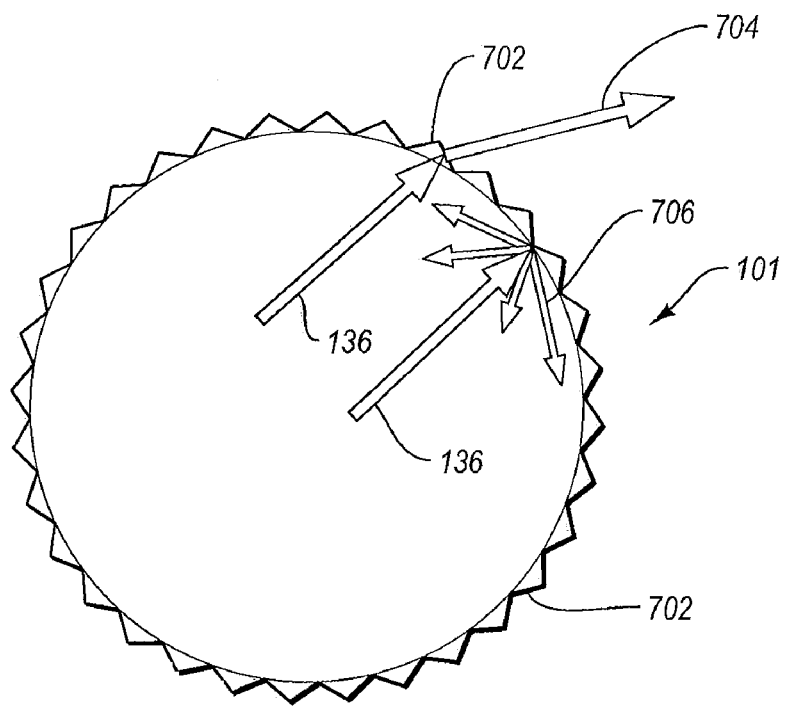
FIG. 7 illustrates irregularities formed on a VCSEL mesa wall.

Another category of optimizations that may be used to couple spontaneous emissions 136 (FIG. 1) out of the VCSEL cavity is geometric modifications of the VCSEL. Referring now to FIG. 7, a top view of a VCSEL 101 is illustrated with one example of geometric modifications shown. The top view illustrated in FIG. 7 is a top view of a mesa structure. The VCSEL 101 includes irregularities 702 formed on the walls of the mesa structure. The irregularities may effect the spontaneous emissions 136 in various ways. In one example, a spontaneous emission interacts with an irregularity 702 which causes the spontaneous emission to couple out of the VCSEL cavity as is shown by the emission 704 illustrated in FIG. 7. The irregularities may also serve to scatter the spontaneous emissions 136 even when the spontaneous emissions 136 are not coupled out of the VCSEL cavity. FIG. 7 illustrates a spontaneous emission 136 striking an irregularity causing scattered emissions 706. At least a portion of the scattered emissions 706 are likely to be at angles that will allow them to couple out of the VCSEL cavity when the scattered emissions strike other irregularities 702.

Geometric optimizations may be formed in a number of different ways. By way of example, and not limitation, irregularities 702 may be formed in one embodiment by using a wet etch to "frost" walls of a mesa structure. In another embodiment, the irregularities may include features that are formed lithographically. Specifically, irregularities may be a part of a photomask that is used to form portions of the mesa.

Photodiode Optical Aperture

Figure 8:
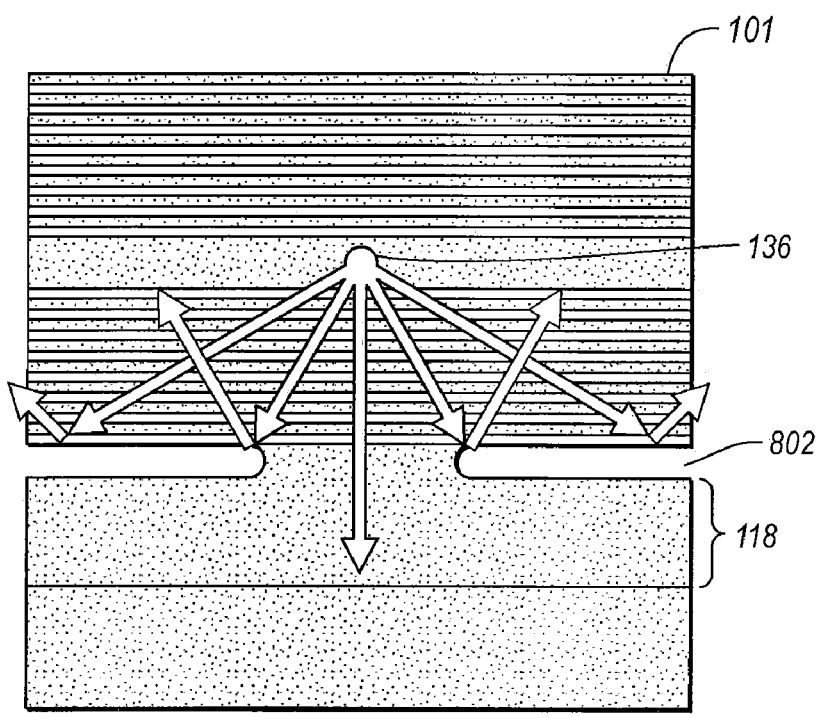
FIG. 8 illustrates an aperture between a VCSEL and a photodiode.

Another category of optimizations relates to an optical aperture formed between a VCSEL and a photodiode. Referring now to FIG. 8, an exemplary aperture is illustrated. FIG. 8 illustrates an aperture 802 between a VCSEL 101 and a photodiode 118. The aperture 802 blocks spontaneous emissions 136 that are emitted sufficiently off-axis by reflecting the spontaneous emissions away from the photodiode 118. Whereas a large majority of the spontaneous emissions 136 are off-axis, a large majority of the spontaneous emissions 136 will be blocked from entering the photodiode 118. The amount of spontaneous emissions 136 that are blocked can be controlled by the size of the optical aperture 802.

Optical apertures may be formed in a number of ways. For example, the optical aperture may be formed, in one embodiment, from an oxidized material. In other embodiments, the aperture may be formed by etching a material out to form a free space aperture. For example, in AlGaAs devices, a buried layer may be formed with a high Al concentration. An oxidizing agent or etchant could then be used in the photolithographic process to either oxidize the high Al concentration material or to etch away the high Al concentration material to form the optical aperture 802.

In some embodiments the aperture may be formed by using an absorbing material. Thus, rather than being reflected, such as when the aperture is a free-space aperture, light is absorbed by the aperture.

DBR Mirror Structure

Another category of optimizations relates to optimizations of the DBR mirror structure. As mentioned previously herein, and referring again to FIG. 1, the average refractive index of the bottom DBR mirror 106 and the refractive index of the active region 104 results in a critical angle of about 60-70° for spontaneous emissions 136 directed towards the bottom mirror 106 (and photodiode 118). Spontaneous emissions 136 at angles greater than the critical angle will be totally internally reflected away from the photodiode 118 such as is illustrated by the reflected emission 140. Thus, one method of reducing the amount of spontaneous emissions 136 that reach the photodiode 118 includes reducing the critical angle. Because the spontaneous emissions 136 are isotropic, decreasing the critical angle will increase the portion of the downward directed spontaneous emissions 136 that are totally internally reflected away from the photodiode 118.

Figure 9:
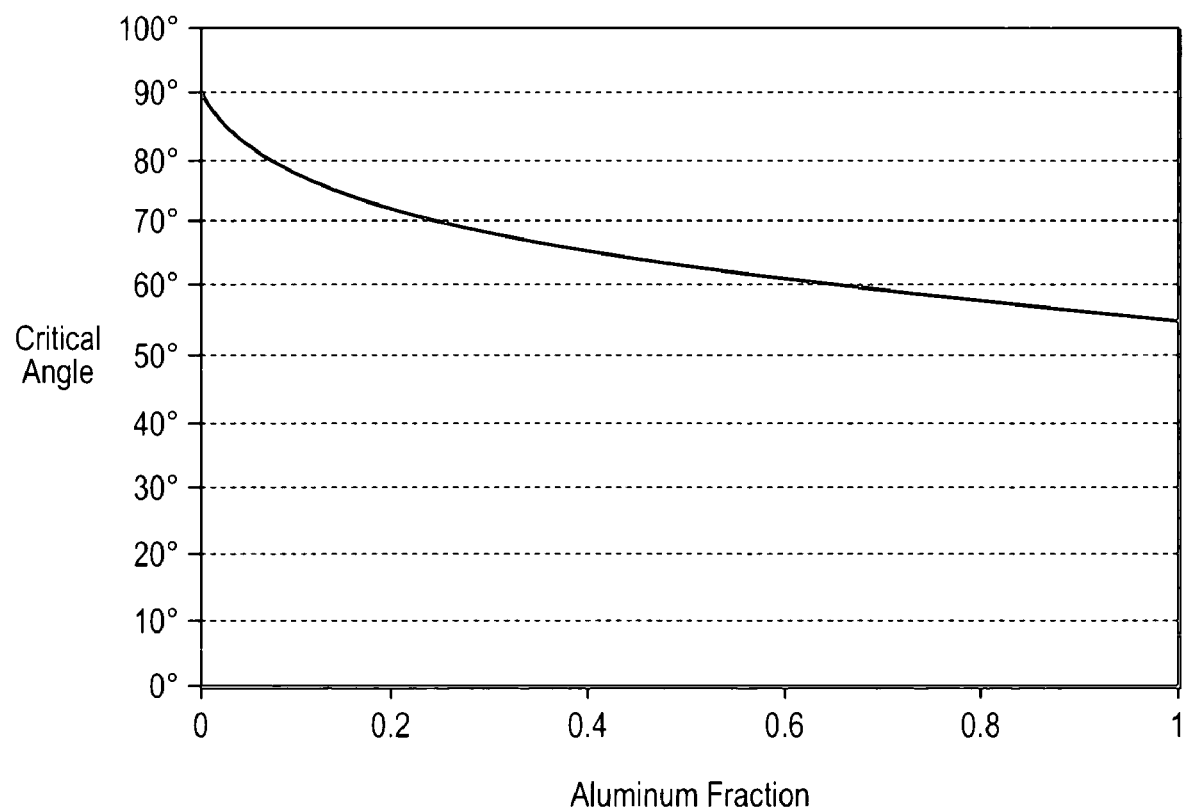
FIG. 9 illustrates a plot of critical angle versus aluminum fraction in VCSEL materials.

Changing the critical angle may be accomplished in GaAs mirrors by adjusting the Al fraction in AlGaAs mirror layers. Referring now to FIG. 9, a correlation between the Al fraction and critical angle is shown. As illustrated in the graph of FIG. 9, by increasing the Al fraction in one or both of the DBR mirror period layers, the critical angle can be decreased resulting in a reduction of spontaneous emissions reaching the photodiode 118 (FIG. 1). This effect is a result of decreasing the average index of refraction of the mirrors.

In another embodiment, the bottom DBR mirror 106 may be optimized so as to reduce transmission of off-axis emissions without severe adverse effects to the on-axis reflectance. In one example, additional DBR mirror layers are added to the bottom DBR mirror 106. The mirror periods may be optimized to reduce transmission for emissions emitted at a specific angle. It can be shown, for example, that a large contribution to spontaneous emissions 136 that strike the photodiode 118 results from the spontaneous emissions 136 that are emitted at 40° off-axis. Ordinarily, the bottom DBR mirror 106 includes ½ wavelength mirror periods where each mirror period comprises alternating ¼ wavelength layers. In one embodiment designed to reduce transmission of 40° off-axis emissions toward the photodiode 118, an additional six bottom DBR mirror periods are formed below (between the DBR mirror 106 shown in FIG. 1 and the photodiode 118) the DBR ½ wavelength mirror periods. The additional six periods are ¾ wavelength periods, comprising ⅜ wavelength alternating layers. This particular fabrication reduces transmission of 40° off-axis emissions by about one half.

Photodiode Optimizations

Figure 10:
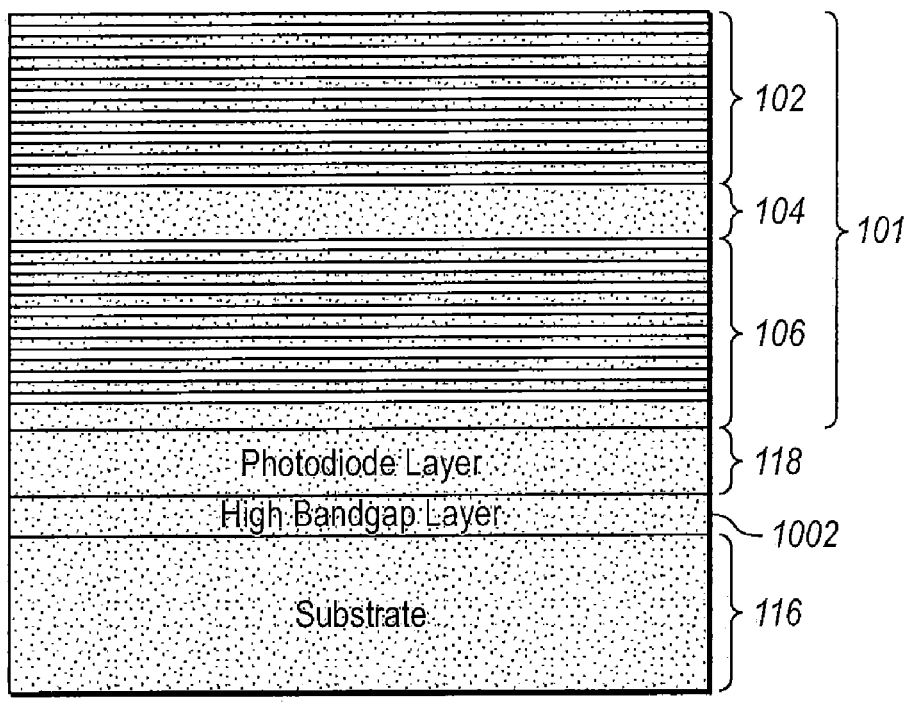
FIG. 10 illustrates an integrated VCSEL and photodiode with a high bandgap layer.

Another category of optimization relate to changes in the fabrication of the photodiode 118. For example, one optimization includes increasing the bandgap in the photodiode 118 to reduce responsivity of the photodiode above the wavelength for which the VCSEL 101 is designed, i.e. a laser emission 138. Referring now to FIG. 10, another optimization involves fabricating a wide bandgap layer 1002 optically coupled and next to the photodiode 118 on the side opposite the VCSEL 101 (in this case beneath the photodiode 118) to prevent substrate absorption contribution to long wavelength responsivity.

Figure 11:
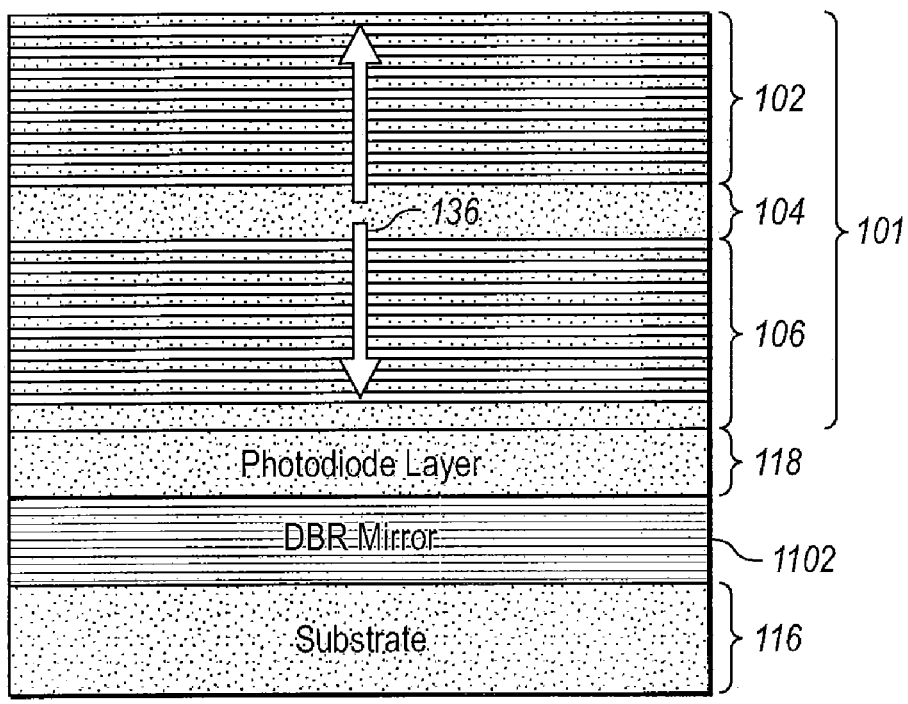
FIG. 11 illustrates an integrated VCSEL and photodiode with an additional DBR mirror under the photodiode.
Figure 5:
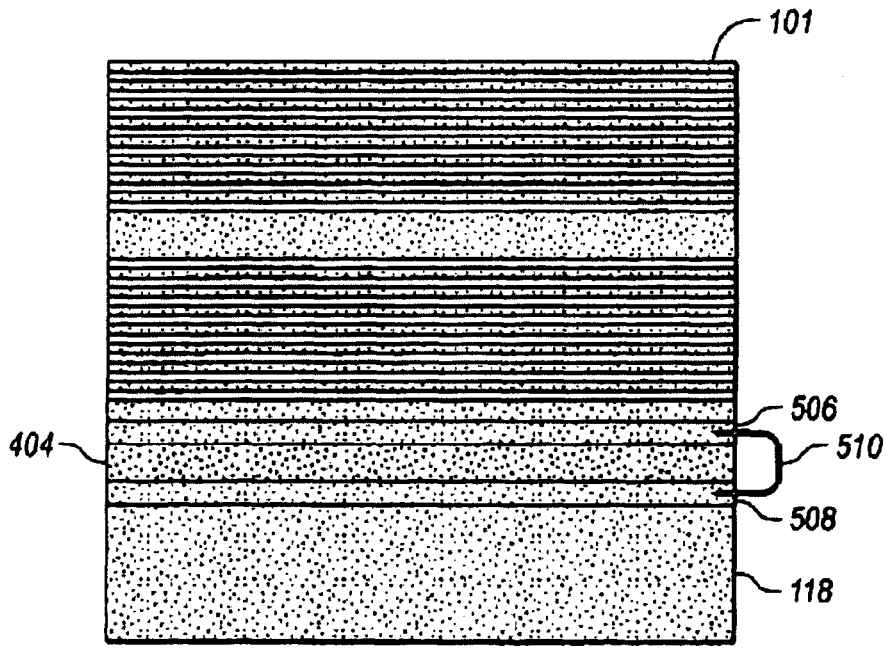

Referring now to FIG. 11, yet another embodiment focuses on increasing measurements of the laser emissions 138. This embodiment includes fabricating a DBR mirror 1102 on a side of the photodiode 118 opposite the VCSEL 101 (in this case under the photodiode 118). The reflectivity of the DBR mirror 1102 under the photodiode 118 is fabricated so as to efficiently reflect the wavelength of light of the laser emission 138. Reflections from the DBR mirror 1102 under the photodiode 118 result in the photodiode getting a "second chance" at the laser emission 138, once when the laser emission 138 passes through the photodiode 118 toward the DBR mirror 1102, and once when the laser emission 138 is reflected off the DBR mirror 1102 back into the photodiode 118. Illustratively, a laser emission 138 passes through the bottom DBR mirror 106 to the photodiode 118, through the photodiode 118 to the DBR mirror 1102 where it is reflected back through the photodiode 118.

In contrast, the DBR mirror 1102 may be constructed such that reflectivity for wavelengths other than the laser emission 138 and for off-axis emissions, such as is typical of spontaneous emissions 136, is lower than for laser emissions 138. Thus, less of the undesirable spontaneous emissions 136 are sensed by the photodiode 118 as a result of being reflected back through the photodiode 118.

As discussed herein previously, optimizations may be combined or used separately. For example, one embodiment finds application in VCSEL/photodiode combinations used in self mixing laser applications such as those discussed in U.S. Patent application No. 60/605,875, titled Vertical Cavity Surface Emitting Laser Optimized For Thermal Sensitivity, filed Aug. 31, 2004, which is incorporated herein by reference. This embodiment incorporates: (a) absorbing compositions in low-bandgap mirror layers; (b) absorbing layers between the bottom DBR mirror 106 and the photodiode 118 including a shorted pn junction; (c) an etched optical aperture between the mirror 106 and the photodiode 118; (d) additional mirror periods to increase off-axis reflection; (e) an increased bandgap in the photodiode 118 to reduce responsivity above the lasing wavelength; (f) a wide bandgap layer beneath the photodiode 118 to prevent to prevent substrate absorption contribution to long wavelength responsivity; (g) electrical contacts 124 with higher absorption; and (g) ion implants 126 to reduce photoluminescence efficiency.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

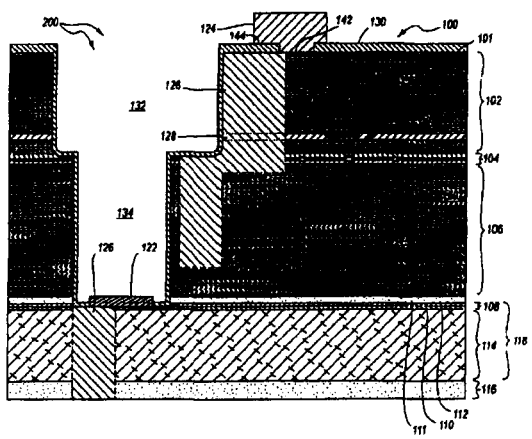

What is claimed is:

1. An optical structure comprising:
   a VCSEL, the VCSEL comprising:
      a top DBR mirror;
      an active region coupled to the top DBR mirror; and
      a bottom DBR mirror coupled to the active region;
   a photodiode coupled to the VCSEL;
   a tunnel diode that acts as a common connection between the VCSEL and the photodiode, the tunnel diode including a doped p layer and a doped n layer; and
   an optical aperture formed between the VCSEL and the photodiode and configured to block spontaneous emissions.

2. The optical structure of 1, wherein the optical aperture comprises an oxidized material.

3. The optical structure of 1, wherein the optical aperture comprises an absorbing material.

4. A method of manufacturing an optical structure comprising:
   forming a VCSEL, wherein forming the VCSEL comprises:
      forming a top DBR mirror;
      forming an active region coupled to the top DBR mirror; and
      forming a bottom DBR mirror coupled to the active region;
   forming a photodiode coupled to the VCSEL;
   forming a tunnel diode that acts as a common connection between the VCSEL and the photodiode, the tunnel diode including a doped p layer and a doped n layer; and
   forming an optical aperture formed between the VCSEL and the photodiode and configured to block spontaneous emissions.

5. The method of claim 4, wherein forming the optical aperture comprises oxidizing a material.

6. The method of claim 4, wherein the optical aperture comprises an absorbing material.

7. The method of claim 4, wherein the optical aperture is formed from a layer with a high Al concentration interacting with an oxidizing agent.

* * * * *

UNITED STATES PATENT AND TRADEMARK OFFICE
CERTIFICATE OF CORRECTION

PATENT NO. : 7,418,021 B2  Page 1 of 5
APPLICATION NO. : 11/026355
DATED : August 26, 2008
INVENTOR(S) : Guenter et al.

It is certified that error appears in the above-identified patent and that said Letters Patent is hereby corrected as shown below:

The title page showing the illustrative figure should be deleted to be replaced with the attached title page The drawing sheets, consisting of Figs. 1, 5 and 11, should be deleted to be replaced with the drawing sheets, consisting of Figs. 1, 5 and 11, as shown on the attached pages Drawings
Sheet 1, replace FIG. 1 with the figure depicted below, wherein interface 142 and interface 144 are added

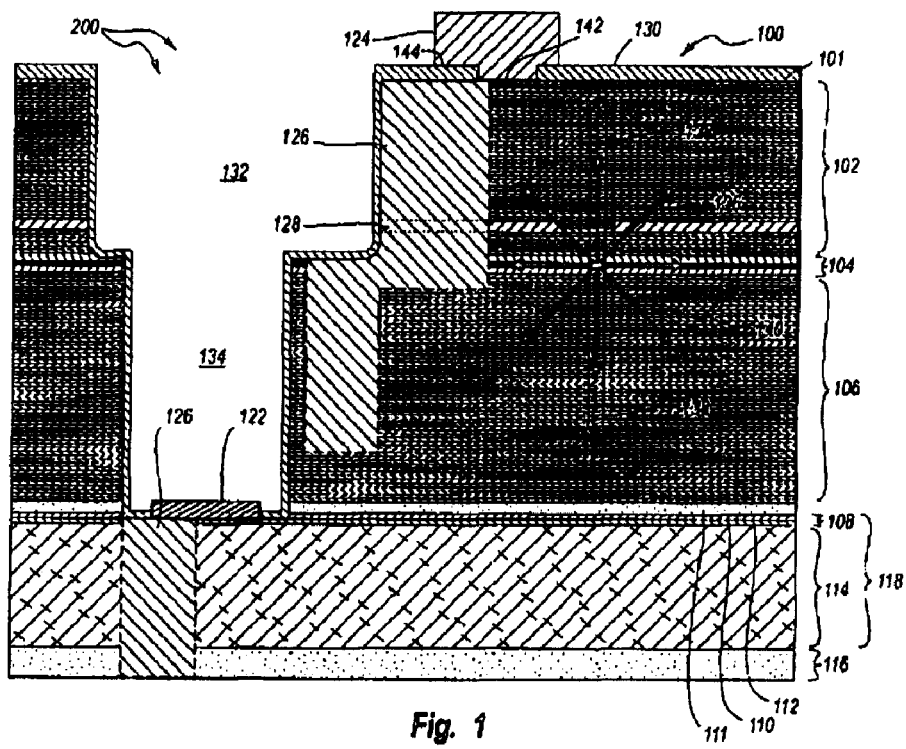

Fig. 1

Signed and Sealed this

Eighteenth Day of May, 2010

David J. Kappos
*Director of the United States Patent and Trademark Office*

Sheet 3, replace FIG. 5 with the figure depicted below, wherein absorbing layer 104 is relabeled 404

Sheet 7, replace FIG. 11 with the figure depicted below, wherein laser emissions 136 are relabeled 138

CERTIFICATE OF CORRECTION (continued)
U.S. Pat. No. 7,418,021 B2

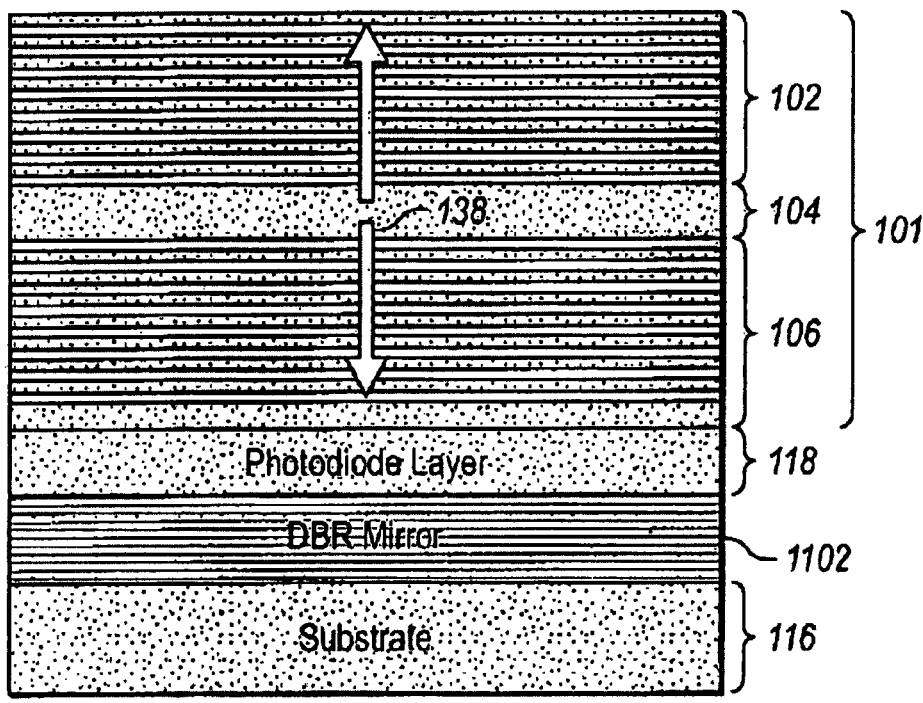

Fig. 11

Column 1
Line 63, change "on axis" to --on-axis--
Line 66, change "p type" to --p-type--
Line 67, change "pn junction" to --p-n junction--

Column 2
Line 1, change "p type" to --p-type--
Line 57, change "laser emission" to --laser emissions--
Line 60, change "on axis" to --on-axis--
Lines 62 and 63, change "spontaneous emission that are off axis" to --spontaneous emissions that are off-axis--

Column 4
Lines 55 and 56, change "pn junction" to --p-n junction--

Column 5
Line 18, change "pn junction" to --p-n junction--
Line 25, change "actually" to --actually,--
Line 26, change "invention" to --invention,--
Line 26, change "microns" to --microns,--
Line 49, change "p type materials" to --p-type materials,--
Line 58, change "n type" to --n-type--
Line 60, change "n type" to --n-type--
Line 67, change "p type" to --p-type--

Column 6

Line 47, change "dielectric" to --dielectric,--
Line 47, change "nitride" to --nitride,--

Column 7
Line 4, change "VCSEL and the photodiode" to --VCSEL 101 and the photodiode 118--
Line 5, change "the VCSEL and the photodiode." to --the VCSEL 101 and the photodiode 118.--
Line 5, change "The VCSEL" to --The VCSEL 101--
Line 6, change "photodiode" to --photodiode 118--
Line 7, change "The photodiode" to --The photodiode 118--
Line 8, change "the VCSEL" to --the VCSEL 101--
Line 33, change "photodiode" to --photodiode 118--
Line 48, change "VCSEL." to --VCSEL 101.--

Column 9
Line 67, change "laser emissions 138" to --laser emissions 138 (FIG. 1)--

Column 10
Line 1, change "spontaneous emissions 136." to --spontaneous emissions 136 (FIG. 1).--
Line 26, change "VCSEL." to --VCSEL 101 (FIG. 1).--
Line 29, change "DBR mirror 102" to --DBR mirror 102 (FIG. 1)--
Line 39, change "Figure 606" to --Curve 606--
Line 41, change "Figure 608" to --Curve 608--
Line 63, change "emissions 136" to --emissions 136,--

Column 11
Line 50, change "photodiode 118" to --photodiode 118,--

Column 12
Line 24, change "relate" to --relates--
Line 25, change "photodiode 118." to --photodiode 118 (FIG. 1).--
Line 27, change "photodiode" to --photodiode 118--
Line 28, change "VCSEL 101" to --VCSEL 101 (FIG. 1)--
Line 29, change "emissions 138." to --emissions 138 (FIG. 1).--
Line 56, change "emissions 136" to --emissions 136 (FIG. 1)--

Column 13
Line 9, change "ion implants 126" to --ion implants--

CERTIFICATE OF CORRECTION (continued)

(12) United States Patent
Guenter et al.

(10) Patent No.: US 7,418,021 B2
(45) Date of Patent: *Aug. 26, 2008

(54) OPTICAL APERTURES FOR REDUCING SPONTANEOUS EMISSIONS IN PHOTODIODES

(75) Inventors: James K. Guenter, Garland, TX (US); Jimmy A. Tatum, Plano, TX (US); James R. Biard, Richardson, TX (US)

(73) Assignee: Finisar Corporation, Sunnyvale, CA (US)

(*) Notice: Subject to any disclaimer, the term of this patent is extended or adjusted under 35 U.S.C. 154(b) by 283 days.

This patent is subject to a terminal disclaimer.

(21) Appl. No.: 11/026,355

(22) Filed: Dec. 30, 2004

(65) Prior Publication Data
US 2005/0286584 A1 Dec. 29, 2005

Related U.S. Application Data

(63) Continuation-in-part of application No. 10/877,915, filed on Jun. 25, 2004, now Pat. No. 7,184,454.

(51) Int. Cl.
*H01S 5/00* (2006.01)
(52) U.S. Cl. .................... 372/50.21; 372/50.1
(58) Field of Classification Search ......... 372/50.1, 372/50.21
See application file for complete search history.

(56) References Cited

U.S. PATENT DOCUMENTS

| | | | |
|---|---|---|---|
| 5,475,701 A | 12/1995 | Hibb-Brenner | |
| 5,606,572 A * | 2/1997 | Swirhun et al. | 372/96 |
| 5,978,401 A | 11/1999 | Morgan | |
| 6,034,981 A * | 3/2000 | Kim | 372/50.21 |
| 6,483,862 B1 * | 11/2002 | Aronson et al. | 372/50.21 |
| 6,707,027 B2 | 3/2004 | Liess et al. | |
| 6,717,972 B2 * | 4/2004 | Steinle et al. | 372/50.21 |
| 6,813,293 B2 * | 11/2004 | Johnson et al. | 372/46.015 |
| 7,184,455 B2 * | 2/2007 | Guenter et al. | 372/50.21 |

(Continued)

FOREIGN PATENT DOCUMENTS

| | | | |
|---|---|---|---|
| WO | WO 02/37124 | 5/2002 | 3/36 |

(Continued)

OTHER PUBLICATIONS

U.S. Appl. No. 11/026,095 filed Dec. 30, 2004 entitled "Obsorbing Layers for Reduced Spontaneous Emission Effects in Integrated Photodiode.".

(Continued)

*Primary Examiner*—Minsun Harvey
*Assistant Examiner*—Phillip Nguyen
(74) *Attorney, Agent, or Firm*—Workman Nydegger

(57) ABSTRACT

An optical structure that reduces the effects of spontaneous emissions from the active region of a laser. An optical structure includes optimizations to reduce the effects of spontaneous emissions. The optical structure includes a VCSEL with top and bottom DBR mirrors and an active region connected to the mirrors. The optical structure further includes a photodiode connected to the VCSEL. One or more optimizations may be included in the optical structure including optically absorbing materials, varying the geometry of the structure to change reflective angles, using optical apertures, changing the reflectivity of one or more mirrors, changing the photodiode to be more impervious to spontaneous emissions, and using ion implants to reduce photoluminescence efficiency.

7 Claims, 7 Drawing Sheets